United States Patent
Huang et al.

(10) Patent No.: US 9,412,703 B1
(45) Date of Patent: Aug. 9, 2016

(54) CHIP PACKAGE STRUCTURE HAVING A SHIELDED MOLDING COMPOUND

(71) Applicant: Powertech Technology Inc., Hsinchu County (TW)

(72) Inventors: Chien-Wen Huang, Hsinchu County (TW); Ming-Hung Chang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 14/623,517

(22) Filed: Feb. 17, 2015

(51) Int. Cl.
*H01L 23/00* (2006.01)
*H01L 23/552* (2006.01)
*H01L 23/31* (2006.01)
*H01L 23/498* (2006.01)
*H01L 23/29* (2006.01)

(52) U.S. Cl.
CPC ............ *H01L 23/552* (2013.01); *H01L 23/293* (2013.01); *H01L 23/3121* (2013.01); *H01L 23/49838* (2013.01); *H01L 23/49866* (2013.01); *H01L 2924/181* (2013.01)

(58) Field of Classification Search
CPC .................................................. H01L 2924/181
See application file for complete search history.

(56) References Cited

U.S. PATENT DOCUMENTS

| | | | | |
|---|---|---|---|---|
| 5,650,659 A * | 7/1997 | Mostafazadeh | ....... | H01L 23/315 257/659 |
| 6,294,731 B1 * | 9/2001 | Lu | ........................ | H01L 23/433 174/388 |
| 7,187,060 B2 * | 3/2007 | Usui | ................. | H01L 23/49822 257/659 |
| 8,507,080 B2 * | 8/2013 | Mahler | ..................... | B32B 7/12 257/783 |
| 8,598,690 B2 * | 12/2013 | Chandra | ............... | H01L 21/561 174/377 |
| 9,123,663 B2 * | 9/2015 | Kim | ....................... | H01L 21/561 |
| 9,293,349 B2 * | 3/2016 | Kim | ....................... | H01L 21/561 |
| 2009/0302436 A1 * | 12/2009 | Kim | ....................... | H01L 21/561 257/659 |
| 2009/0302437 A1 * | 12/2009 | Kim | ....................... | H01L 21/561 257/659 |
| 2010/0140759 A1 * | 6/2010 | Pagaila | ................. | H01L 21/565 257/660 |
| 2012/0104573 A1 * | 5/2012 | Pagaila | ................. | H01L 21/561 257/659 |
| 2012/0228749 A1 * | 9/2012 | Pagaila | ................. | H01L 23/147 257/659 |
| 2012/0300412 A1 * | 11/2012 | Song | ..................... | H01L 23/552 361/728 |
| 2013/0020685 A1 * | 1/2013 | Kwak | ................... | H01L 23/552 257/659 |
| 2014/0198459 A1 * | 7/2014 | Cheng | .................... | H01L 24/97 361/730 |
| 2014/0300004 A1 * | 10/2014 | Choi | ..................... | H01L 21/561 257/774 |
| 2014/0319661 A1 * | 10/2014 | Pagaila | ................. | H01L 23/147 257/659 |

* cited by examiner

*Primary Examiner* — Ida M Soward
(74) *Attorney, Agent, or Firm* — Jianq Chyun IP Office

(57) ABSTRACT

A chip package structure including a main substrate, a carrier substrate, at least a chip, a molding compound, a shielding layer and a plurality of connection structures between the main substrate and the carrier substrate. The shielding layer covers the top surface and the sidewalls of the molding compound and a portion of the carrier substrate. The shielding layer is electrically grounded through the connection structures.

6 Claims, 4 Drawing Sheets

CHIP PACKAGE STRUCTURE HAVING A SHIELDED MOLDING COMPOUND

BACKGROUND OF THE INVENTION

1. Field of the Invention

The present invention relates to a semiconductor device, and more particularly to a chip package structure.

2. Description of Related Art

Electromagnetic interference (EMI) is a disturbance caused by an electromagnetic field which impedes the proper performance of an electronic device. Since EMI can arise from a number of sources, EMI is present in all areas of electronics. Hence, for the electronic devices, it is important to have efficient EMI protection to reduce the level of EMI to an acceptable level and to ensure the normal operation.

SUMMARY OF THE INVENTION

The embodiments of the present invention are directed to chip package structures with effective EMI shielding.

The present invention provides a chip package structure including a main substrate, a carrier substrate disposed over the main substrate, at least a chip disposed on and electrically connected to the carrier substrate, a molding compound, a shielding layer disposed directly on the molding compound and a plurality of first connection structures and a plurality of second connection structures located between the main substrate and the carrier substrate. The main substrate has a first circuit layer including a plurality of pads, and the carrier substrate has a second circuit layer including a plurality of contacts. The molding compound disposed over the carrier substrate at least encapsulates the chip and a portion of the carrier substrate. The shielding layer conformally covers a top surface and sidewalls of the molding compound and covers an upper sidewall portion of the carrier substrate. The at least one chip and the carrier substrate are electrically connected to the main substrate through the plurality of first metal connection structures. The shielding layer is electrically connected to the carrier substrate through the plurality of second connection structures.

According to one embodiment of the present invention, the second circuit layer of the carrier substrate functions as a ground layer and the shielding layer is electrically connected to the ground layer through the plurality of second connection structures and is grounded.

According to one embodiment of the present invention, the first circuit layer of the main substrate functions as a ground layer and the shielding layer is electrically connected to the ground layer through the plurality of second connection structures and is grounded.

According to one embodiment of the present invention, a material of the shielding layer comprises aluminum, copper, chromium, gold, silver, nickel, a solder material, or the combinations thereof.

According to one embodiment of the present invention, the chip is a power chip or a radio-frequency chip.

According to one embodiment of the present invention, a material of the molding compound includes an epoxy resin.

According to one embodiment of the present invention, a material of the plurality of the second connection structures includes a eutectic Sn—Pb alloy or a tin/silver/copper alloy (SAC alloy) or a lead-free solder material.

Based on the above, the shielding layer fully covering the molding compound and a portion of the carrier substrate of the chip package provide effective EMI shield of the chip package. Also, because of the full coverage of the shielding layer, the moisture barrier and the reliability of the package can be improved.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
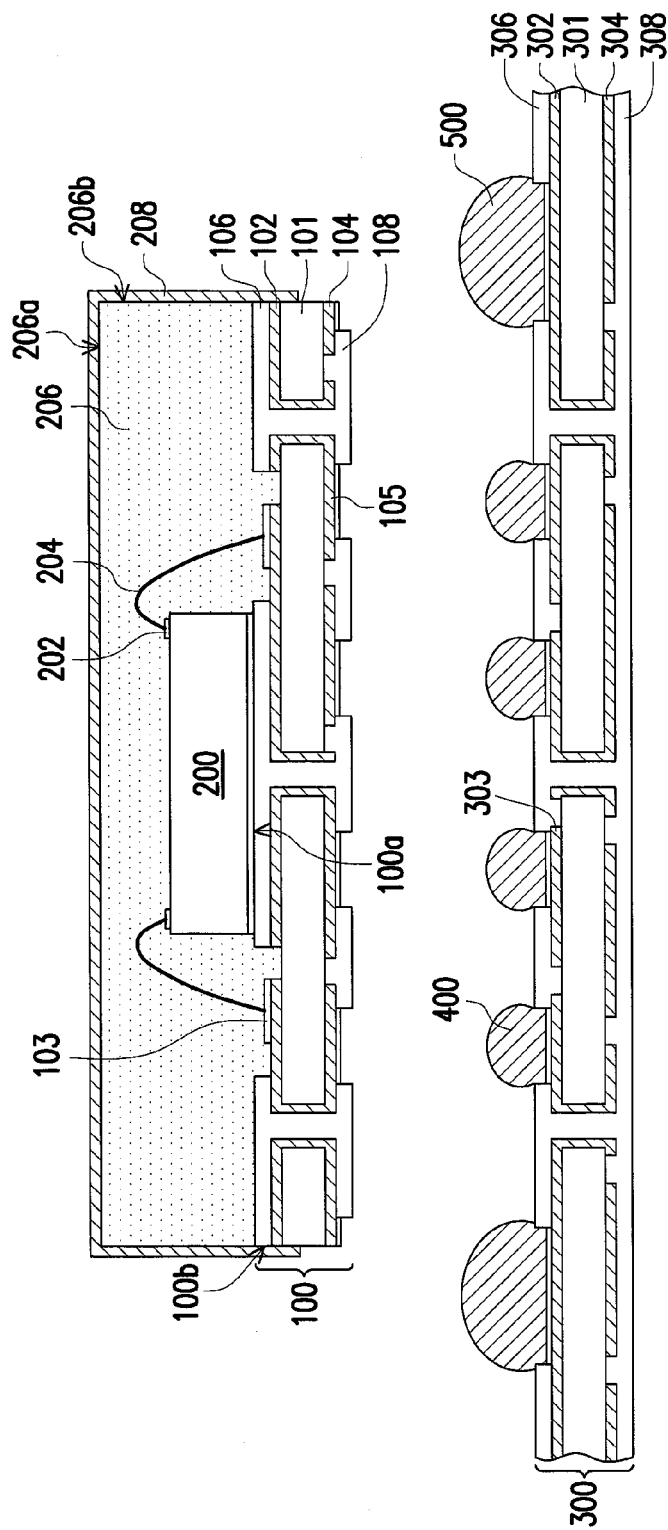
FIG. 1 is a schematic cross-sectional view showing a chip package before assembly according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The manufacturing methods as described in the present invention can be used for fabricating various package structures and are suitable for fabricating packages of surface mounted devices packages or packages of multiple chip or electronic devices.

Figure 2:
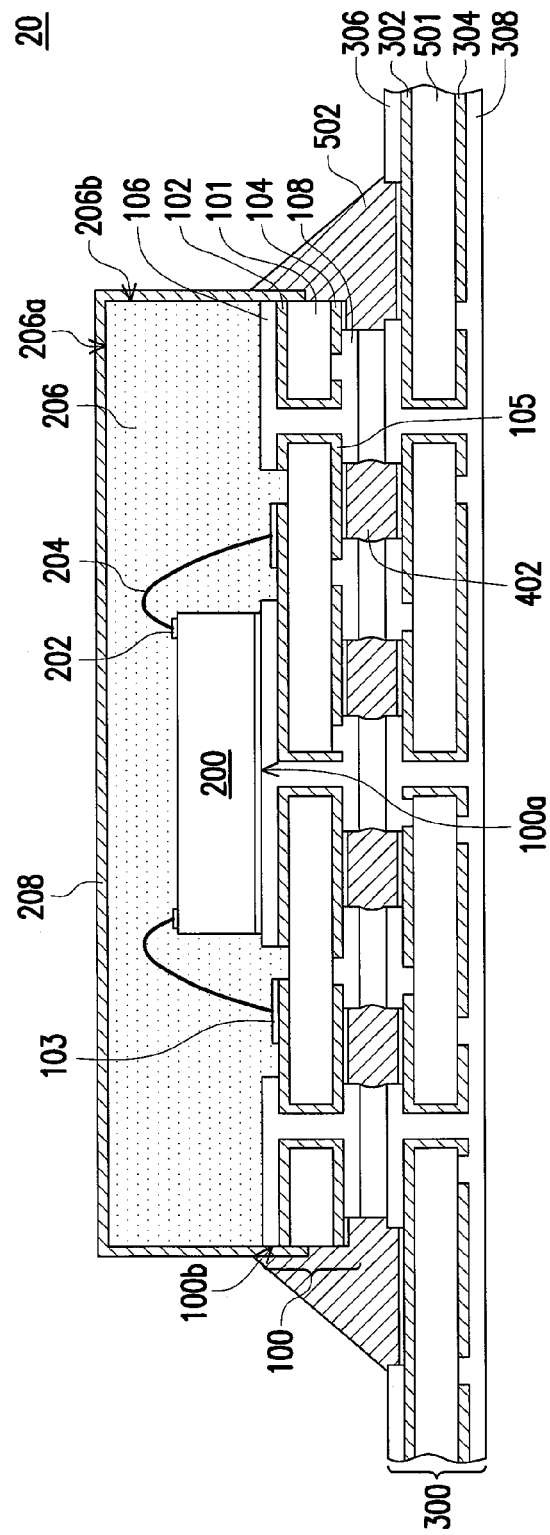
FIG. 2 is a schematic cross-sectional view showing the chip package according to one preferred embodiment of the present invention.

FIG. 1 is a schematic cross-sectional view showing a chip package before assembly according to one preferred embodiment of the present invention. FIG. 2 is a schematic cross-sectional view showing the chip package after assembly according to one preferred embodiment of the present invention.

Referring to FIG. 1, a carrier substrate 100 having a dielectric layer 101, an upper circuit layer 102 including a plurality of bonding pads 103 thereon and a lower circuit layer 104 including a plurality of contacts 105 is provided. The carrier substrate 100 also includes an upper insulating layer 106 disposed on and partially covering the upper circuit layer 102 and a lower insulating layer 108 disposed on and partially covering the lower circuit layer 104. The lower circuit layer 104 may function as a ground layer. The contacts 105 may function as bump pads for flip chip connecting technology. The carrier substrate 100 can be a laminate substrate, for example, a printed circuit board (PCB) or a flexible printed circuit board (FPCB).

Referring to FIG. 1, at least a chip 200 is disposed on the top surface 100a of the carrier substrate 100. Although a chip is provided herein, other surface mount devices (SMD) or surface mount components may be installed and are encompassed within the scope of this invention. The contacts 202 of the chip 200 is electrically connected to the bonding pads 103 on the upper circuit layer 102 of the carrier substrate 100 through a plurality of wires 204. Although wire bonding technology is described herein, it is well encompassed within the scope of this invention to employ flip chip connecting technology for connecting the chip and the carrier substrate. The chip 200 preferably is disposed within a central portion of the carrier substrate 100. Also, a molding compound 206 is disposed on the carrier substrate 100 and encapsulates the chip 200, the contacts 202 and the wires 204. The molding compound 206 may be formed by an over-molding process, for example. The material of the molding compound 206 may be epoxy resins, for example. A shielding layer 208 is conformally formed over the molding compound 206 and conformally covers the top surface 206a and the sidewalls 206b of the molding compound 206 and the upper sidewalls (the upper sidewall portion) 100b of the carrier substrate 100. That is, although the shielding layer 208 is connected with the upper circuit layer 102, the shielding layer 208 is not in physical contact with the lower circuit layer 104. The shielding layer 208 is not connected to the ground layer 104 of the carrier substrate 100 and therefore is not yet grounded. The shielding layer 208 can be formed by spray coating, plating a sputtering, for example. The material of the shielding layer 208 may be, for example, aluminum, copper, chromium, gold, silver, nickel, solder materials, or the combinations thereof. Considering the contacts 105 arranged in arrays, the integrated structure of the carrier substrate 100, the chip 200, the molding compound 206 and the shielding layer 208 may be considered as a land grid array type package portion.

Referring to FIG. 1, a main substrate 300 having a core dielectric layer 301, an upper circuit layer 302 including a plurality of pads 303 and a lower circuit layer 304 is provided. The main substrate 300 also includes an upper insulating layer 306 disposed on and partially covering the upper circuit layer 302 and a lower insulating layer 308 covering the lower circuit layer 304. The upper circuit layer 302 may function as a ground layer. The pads 303 may function as bump pads or ball pads, for example. The main substrate 300 can be a multi-layered substrate, for example, a printed circuit board (PCB). A plurality of bumps 400 and a plurality of solder balls 500 are disposed on the pads 303 of the main substrate 300.

As shown in FIG. 1, the carrier substrate 100 is assembled to the main substrate 300 by placing the carrier substrate 100 on the main substrate 300, and the position of the carrier substrate 100 is adjusted so that the contacts 105 (bumps pads) are aligned with bumps 400 respectively and the shielding layer 208 located on the upper sidewalls 100b aligned with the solder balls 500. The shielding layer 208 is not connected to the ground layer 104 of the carrier substrate 100 and therefore is not yet grounded.

In FIG. 2, after the assembly and reflowing, a chip package structure 20 is obtained. As the structural details and the materials of the carrier substrate 100 and the main substrate 300 are substantially the same as described in the previous paragraphs for describing FIG. 1, the same reference numbers will be used and no further details will be discussed herein again. During the reflowing process, the bumps 400 melt and become connection structures 402 attached to the contacts 105, while the solder balls 500 melt and becomes connection structures 502 for connecting the shielding layer 208, the ground layer 104 and the pads 303. That is, the assembled chip package structure 20 includes the carrier substrate 100 laminated and bonded to the main substrate 300 through the connection structures 402 and 502. In this case, as the shielding layer 208 is connected to the ground layer 104 of the carrier substrate 100 through the connection structures 502, the shielding layer 208 is grounded. It is understood that the shielding layer 208 may be further connected to the ground layer of the main substrate 300.

Referring to FIG. 2, the chip package 20 of the present embodiment includes a carrier substrate 100 having at least a circuit layer 104 including a plurality of contacts 105, at least a chip 200, a molding compound 206, a shielding layer 208, a main substrate 300 having at least a circuit layer 302 including a plurality of pads 303 and a plurality of connection structures 402 and 502 between the contacts 105 of the circuit layer 104 and the pads 303 of the circuit layer 302. The carrier substrate 100 may be a laminated substrate, for example, a FPCB, while the main substrate 300 may be a multi-layered substrate, such as two-layered or a four-layered laminated PCB. The chip 200 can be a semiconductor chip, for example, a power chip or a radio-frequency chip. The material of the shielding layer 208 may be copper, chromium, gold, silver, nickel, aluminum or alloys thereof, for example. The molding compound 206 encapsulates a portions of the carrier substrates 100, the wires 204, and the chip 200. The shielding layer 208 is disposed over the molding compound 206, covering the top surface 206a, the sidewalls 206b of the molding compound 130. The chip 200 and the carrier substrate 100 are electrically connected to the main substrate 300 through the metal connection structures 402. The shielding layer 208 is electrically connected to at least the circuit layer 104 of the carrier substrates 100 through the connection structures 502, so that the shielding layer 208 is electrically grounded. As the connection structures 402, 502 are reflowed bumps or reflowed solder balls, the material of the connection structures 402, 502 may include eutectic tin-lead (Sn—Pb) alloys, tin/silver/copper alloys (SAC alloys) or lead-free solder materials. Taking advantage of the metal connection structures 502, the shielding layer of the present invention can be grounded within the package structure using the ground plane of the carrier substrate and/or the main substrate. The shielding layer can establish an electrical ground path within the package structure, devoid of using an extra ground plane.

In addition, as the shielding layer 208 covers up the upper sidewalls 100b of the carrier substrate 100, the moisture barrier of the package structure is further improved.

In general, the material or the thickness of the shielding layer 208 may be altered depending on the shielding requisites or other electrical properties of the package structure or even varied in accordance with the processing parameters. The material selection and the size of the metal connection structures 502 may be modified according to the size of the chip, the layout and the arrangement of the shielding layer. As long as the shielding layer 208 is electrically connected to the ground layer 104 through the metal connection structures 502 (i.e. reflowed solder balls), proper EMI shielding can be achieved.

Figure 3:
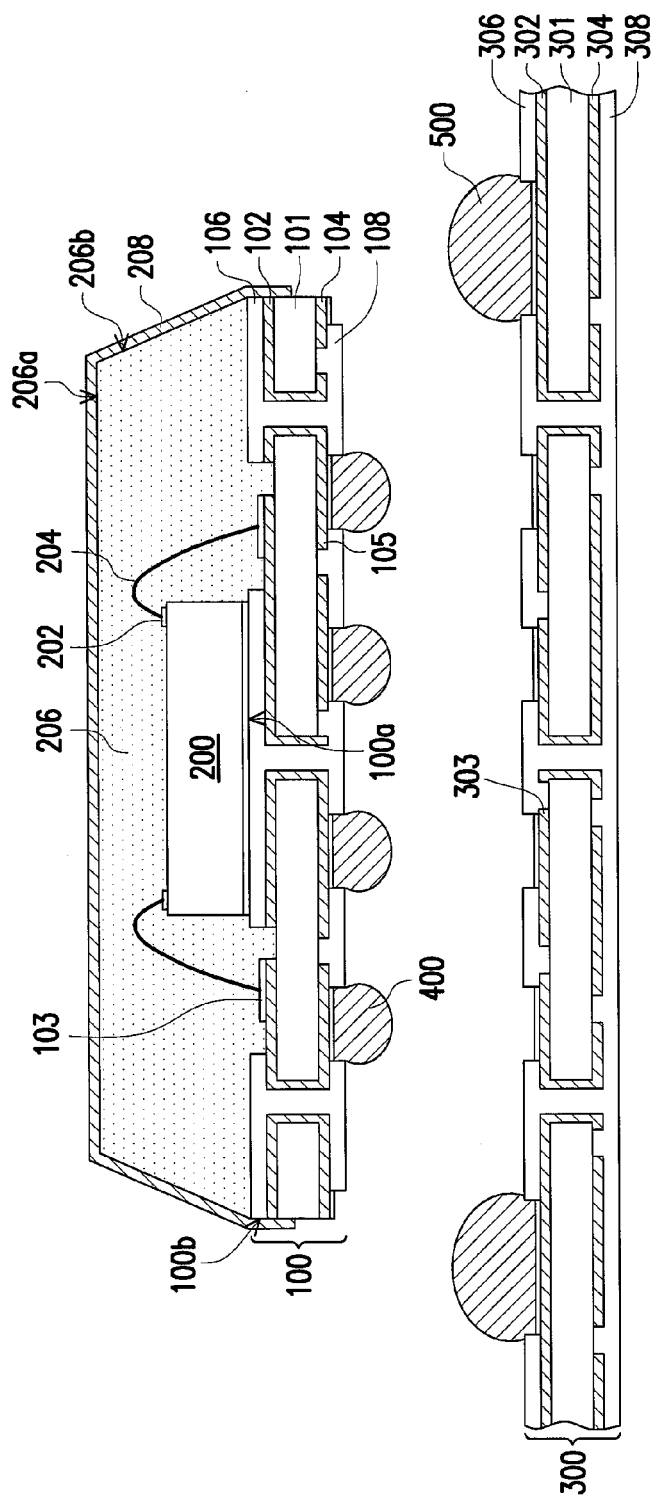
FIG. 3 is a schematic cross-sectional view showing a chip package before assembly according to another preferred embodiment of the present invention.

In accordance with the present invention, the chip package structure may be assembled differently as described in the following embodiment. FIG. 3 is a schematic cross-sectional view showing a chip package before assembly according to another preferred embodiment of the present invention. FIG. 2 is a schematic cross-sectional view showing the chip package after assembly according to another preferred embodiment of the present invention. As the structural details and the materials of the carrier substrate 100 and the main substrate 300 are substantially the same as described in the previous paragraphs for describing FIG. 1, the same reference numbers will be used and no further details will be discussed herein again. In FIG. 3, a plurality of bumps 400 is disposed on the contacts 105 of the lower circuit layer 104 of the carrier substrate 100 before assembly, while a plurality of solder balls 500 is disposed on the pads 303 of the upper circuit layer 302 of the main substrate 300. Herein, considering the bumps 400 on the contacts 105 arranged in arrays, the integrated structure of the carrier substrate 100, the chip 200, the molding compound 206, the shielding layer 208 and the bumps 400 may be considered as a ball grid array type package portion.

As shown in FIG. 3, the carrier substrate 100 is assembled to the main substrate 300 by placing the carrier substrate 100 on the main substrate 300, and the position of the carrier substrate 100 is adjusted so that the bumps 400 are aligned with the pads 303 respectively and the shielding layer 208 located on the upper sidewalls 100b aligned with the solder balls 500. Before assembly, the shielding layer 208 is not connected to the ground layer 104 of the carrier substrate 100 and therefore is not yet grounded.

Figure 4:
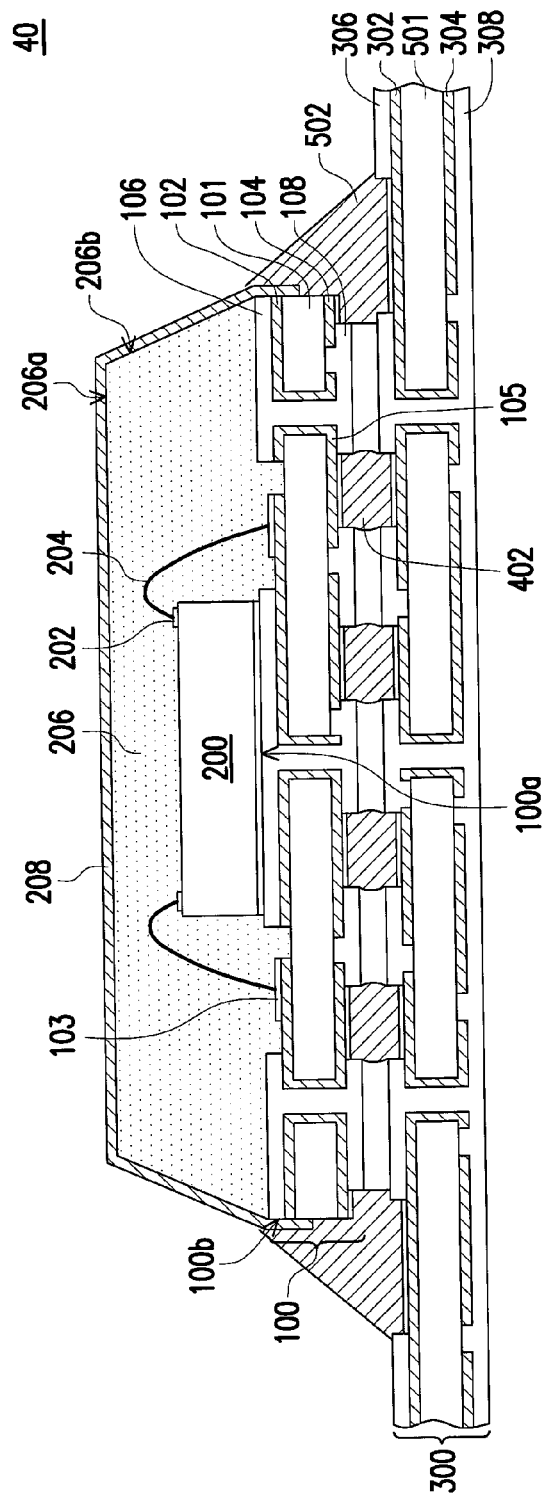
FIG. 4 is a schematic cross-sectional view showing the chip package according to another preferred embodiment of the present invention.

In FIG. 4, after the assembly and reflowing, a chip package structure 40 is obtained. As the structural details and the materials of the carrier substrate 100 and the main substrate 300 are substantially the same as described in the previous paragraphs for describing FIGS. 1 and 3, the same reference numbers will be used and no further details will be discussed herein again. During the reflowing process, the bumps 400 melt and become connection structures 402 attached to the contacts 105, while the solder balls 500 melt and becomes connection structures 502 for connecting the shielding layer 208, the ground layer 104 and the pads 303. That is, the assembled chip package structure 40 includes the carrier substrate 100 laminated and bonded to the main substrate 300 through the connection structures 402 and 502. In this case, as the shielding layer 208 is connected to the ground layer 104 of the carrier substrate 100 and the ground layer 302 of the main substrate 300 through the connection structures 502, the shielding layer 208 is grounded.

Referring to FIG. 4, the chip package 40 of the present embodiment includes a carrier substrate 100 having at least a circuit layer 104 including a plurality of contacts 105, at least a chip 200, a molding compound 206, a shielding layer 208, a main substrate 300 having at least a circuit layer 302 including a plurality of pads 303 and a plurality of connection structures 402 and 502 between the contacts 105 of the circuit layer 104 and the pads 303 of the circuit layer 302. The shielding layer 208 is disposed over the molding compound 206, covering the top surface 206a, the sidewalls 206b of the molding compound 130. The chip 200 and the carrier substrate 100 are electrically connected to the main substrate 300 through the metal connection structures 402. The shielding layer 208 is electrically connected to the circuit layer 104 of the carrier substrates 100 as well as the circuit layer 302 of the main substrate 300 through the connection structures 502, so that the shielding layer 208 is electrically grounded.

In the chip package structures of the present embodiment, the shielding layer disposed over the molding compound and a portion of the carrier substrate function as an EMI shield, so as to protect the chip from the EMI radiation of the surrounding radiation sources and enhance the EMI shielding efficacy of the package. In this case, the full coverage of the shielding layer over the molding compound and a portion of the carrier substrate also improves the moisture barrier of the package and the reliability of the package.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a main substrate having a first circuit layer including a plurality of pads;
   a carrier substrate having a second circuit layer and a third circuit layer, wherein the second circuit layer and third circuit layer are respectively located on two opposite surfaces of the carrier substrate, the second circuit layer has a plurality of contacts and a ground layer, and the carrier substrate is disposed over the main substrate;
   at least one chip disposed on the carrier substrate and electrically connected to the carrier substrate;
   a molding compound disposed over the carrier substrate, at least encapsulating the chip and a portion of the carrier substrate;
   a shielding layer disposed directly on the molding compound, wherein the shielding layer conformally covers a top surface and sidewalls of the molding compound and covers an upper sidewall portion of the carrier substrate, wherein the shielding layer is directly coupled with the third circuit layer through physical contact; and
   a plurality of first connection structures and a plurality of second connection structures located between the plurality of pads of the first circuit layer and the plurality of contacts of the second circuit layer, wherein the at least one chip and the carrier substrate are electrically connected to the main substrate through the plurality of first connection structures, and the shielding layer is electrically connected to and indirectly coupled with the second circuit layer of the carrier substrate through the plurality of second connection structures.

2. The package structure as claimed in claim 1, wherein the first circuit layer of the main substrate includes a ground layer and the shielding layer is electrically connected to the ground layer of the first circuit layer through the plurality of second connection structures and is grounded.

3. The package structure as claimed in claim 1, wherein a material of the shielding layer comprises aluminum, copper, chromium, gold, silver, nickel, a solder material, or the combinations thereof.

4. The package structure as claimed in claim 1, wherein the chip is a power chip or a radio-frequency chip.

5. The package structure as claimed in claim 1, wherein a material of the molding compound includes an epoxy resin.

6. The package structure as claimed in claim 1, wherein a material of the plurality of the second connection structures includes an eutectic Sn—Pb alloy or a tin/silver/copper alloy (SAC alloy) or a lead-free solder material.

* * * * *